United States Patent [19]
Naik

[11] Patent Number: 6,054,380
[45] Date of Patent: Apr. 25, 2000

[54] METHOD AND APPARATUS FOR INTEGRATING LOW DIELECTRIC CONSTANT MATERIALS INTO A MULTILEVEL METALLIZATION AND INTERCONNECT STRUCTURE

[75] Inventor: Mehul Naik, San Jose, Calif.

[73] Assignee: Applied Materials, Inc., Santa Clara, Calif.

[21] Appl. No.: 08/987,219

[22] Filed: Dec. 9, 1997

[51] Int. Cl.[7] .................................................. H01L 21/4763
[52] U.S. Cl. ........................ 438/624; 438/597; 438/626; 438/631; 438/618; 438/645
[58] Field of Search ..................... 438/597, 618, 438/620, 642, 643, 645, 652, 653, 666, 680, 687, 688, 624, 632

[56] References Cited

U.S. PATENT DOCUMENTS

| | | | |
|---|---|---|---|
| 5,236,870 | 8/1993 | Sakata et al. | 438/637 |
| 5,930,655 | 7/1999 | Cooney, III et al. | 438/474 |

*Primary Examiner*—John F. Niebling
*Assistant Examiner*—Viktor Simkovic
*Attorney, Agent, or Firm*—Thomason, Moser and Patterson

[57] ABSTRACT

A method and apparatus for protecting a metal interconnect from corrosion due to contact with a low k dielectric material in a multilevel metallization and interconnect structure. To facilitate such protection, a barrier material, in the form of a sidewall spacer, is deposited between the dielectric material and the metal line.

13 Claims, 5 Drawing Sheets

METHOD AND APPARATUS FOR INTEGRATING LOW DIELECTRIC CONSTANT MATERIALS INTO A MULTILEVEL METALLIZATION AND INTERCONNECT STRUCTURE

BACKGROUND OF THE DISCLOSURE

1. Field of the Invention

The invention relates to semiconductor device fabrication and, more particularly, to a method and apparatus for incorporating low dielectric constant materials within a multilevel metallization and interconnect structure.

2. Description of the Background Art

The integrated circuit industry is moving towards denser device integration and faster switching speeds for devices within the integrated circuits. Until recently, the integrated circuit R-C delay that limits the device switching speeds was dominated by the front-end-of-line (FEOL) CMOS transistor driver capacitance and load resistance. For 0.25 um technology and beyond, the increase in signal delay due to the capacitance of device interconnections is becoming a limitation to improving device performance. To meet circuit speed requirements and to decrease crosstalk between adjacent metal interconnection lines, devices must be fabricated using materials having low dielectric constants (e.g., less than 3.8). In present integrated circuit manufacturing, silicon-dioxide ($SiO_2$), having a dielectric constant of approximately 4.0, is generally used as an insulative material. However, a material with such a relatively high dielectric constant does not meet the speed requirements of today's devices and such materials promote excessive signal crosstalk between adjacent interconnection lines.

Alternative materials having lower dielectric constants than $SiO_2$ include fluorinated silicate glass (FSG), having a dielectric constant between 3.5 and 3.8, as well as amorphous-fluorinated carbon (a-C:F), having a dielectric constant of less than 3.0. Additionally, various fluorinated organic or inorganic, spin-on or vapor deposited dielectric materials, such as fluorinated polyimide, fluorinated poly arylene ethers, parylene-F, and the like, have also been used within integrated circuits as relatively low dielectric constant materials. All of these materials are generally classified as "low k materials" when the dielectric constant (k) is less than 3.8 or "ultra-low k materials" when the dielectric constant (k) is less than 3.0. In this specification, these terms are used interchangeably and represent materials with a dielectric constant less than 4.0.

One process for producing a relatively low k material is by incorporating fluorine, with 2–3 atomic percent to as much as 40 percent, within a base material of silicon dioxide or amorphous carbon to form F—$SiO_2$ or a-C:F, respectively. However, a major problem with integrating these materials into a metallized structure, e.g., a BEOL structure, is that the fluorine corrodes metals such as titanium or aluminum-copper that are typically used for metallization of the integrated circuits. For example, titanium is an integral part of a BEOL metallization process and helps to decrease the interface resistance at the via bottom. However, when titanium is integrated into a fluorine-based oxide, numerous volcanoes are generated on the titanium surface. This volcano formation is due to corrosion of the titanium by the fluorine within the F—$SiO_2$. Such volcanoes cause a decrease in device reliability within the integrated circuit, as well as drastically reduce the lifetime of the device.

Fluorinated oxide deposited using a high-density plasma, where the fluorine is more tightly bonded to the silicon oxide, also has similar problems during integration with metals. In such structures, the fluorine level in the bulk titanium is an order of magnitude higher than the background level in an undoped film. This indicates the fluorine penetrates into the titanium layer deposited on top of the dielectric. Such penetration can lead to an increase in the via/contact resistance, and device failures due to corrosion. Similar problems arise when using aluminum-copper (AlCu) alloys for metallization.

FIGS. 1A through 1D depict a conventional process for producing a BEOL metallization structure. Within the structure, the metals detrimentally contact the dielectric during dielectric deposition and also during metal deposition when performing the plug and/or the interconnect metallization. Specifically, FIG. 1A depicts a pair of metal lines 102 that have been formed on a substrate 100 using either a PVD process to deposit a layer 110 and 112 of titanium or titanium nitride above and below an aluminum-copper conductive layer 114. These lines are generally formed by pattern etching a uniformly deposited stack of metal layers to form the structure shown in FIG. 1A. In FIG. 1B, a low k dielectric material (low k material) is deposited as a layer 104 atop the lines. Note that in this conventional process the metal lines contact the dielectric material of layer 104. In FIG. 1C, a second dielectric layer 116 (e.g., TEOS) is deposited over layer 104. The second dielectric layer is planarized using, for example, a chemical-mechanical polishing process. The second dielectric layer is patterned using a mask and both dielectric layers are etched to form a via 106. Generally, the etch process removes some of the metal material at the bottom of the via to ensure a sufficiently conductive contact will be made between the metal line and the via metallization, e.g., the etch is stopped upon contact with the aluminum-copper layer. In FIG. ID, titanium/titanium-nitride is deposited as a liner 108 to contact the top surface of the metal lines 102. The liner in the via is subsequently filled with aluminum-copper or tungsten.

Within the foregoing conventional process, the metal contacts the low k dielectric when the first dielectric layer is deposited over the metal lines. When the first dielectric material is a fluorine-based, low k material, the metal reacts with the dielectric and detrimentally corrodes. The potential for such corrosion is apparent in the SIMS depth profile of FIG. 2. The SIMS depth profile shows that, when a low k dielectric layer (F—$SiO_2$) is contacted by a titanium layer within a Ti/HDP-FSG stack and annealed at 450° C., as shown in the fluorine concentration curve 200, the fluorine substantially penetrates into the titanium.

Therefore, a need exists in the art for a method and apparatus for fabricating multilevel metallization and interconnect structures that prevent metal corrosion when using low k dielectric materials as insulators.

SUMMARY OF THE INVENTION

The disadvantages associated with the prior art methods of fabricating multilevel metallization and interconnect structures using low k dielectric materials are overcome by the present invention. The present invention is a novel process that forms a structure for protecting a metallization layer from contact with the low k dielectric materials. Specifically, a barrier material is used, such as silicon nitride or a similar material, in the form of a sidewall spacer located between the metal lines and the low k dielectric material.

More specifically, metal lines are formed using a conventional method by depositing a uniform metal layer, patterning the layer and etching the layer to form metal lines atop a substrate. Generally, the metal lines contain a multiple layer structure having a layer of aluminum-copper (or aluminum) between layers of titanium nitride and the entire stack rests upon a layer of titanium. Alternatively, the metal line structure may be fabricated as a plurality of layers including a first layer of tantalum or tantalum-nitride, a layer of copper or copper alloy, and a second layer of tantalum or tantalum-nitride. Once the lines are formed, a layer of protective material such as silicon nitride is deposited over the metal lines. This protective layer ultimately forms the barrier between the metal lines and dielectric low k material. An anisotropic etch is used on the silicon nitride layer to open the silicon nitride atop the metal lines but leaving a silicon nitride coating on the sides of the metal lines. The low k dielectric is then deposited atop the metal lines and silicon nitride.

In a first embodiment of the invention, the low k dielectric is then etched back below the top level of the metal lines. This etch back ensures that the low k dielectric will not form part of the "via dielectric", i.e., the dielectric material between adjacent vias. A PTEOS layer (the via dielectric) is deposited atop the structure and planarized using, for example, chemical-mechanical polishing (CMP). A patterned photoresist is used as a via mask to etch the PTEOS layer to form vias within the PTEOS layer. These vias extend from the top surface of the PTEOS dielectric layer to the top surface of the metal lines. The via etch process also removes the titanium-nitride from the top of the metal line to expose the inner metal, e.g., the aluminum-copper. Finally, a metal layer(s) is deposited to line and fill the vias. Using this process, metal lines do not contact the low k film along the sides of the lines. As such, fluorine within the dielectric material does not penetrate the titanium and corrosion of the metal is eliminated.

In a second embodiment of the invention, an etchback process is not used to restrict the low k dielectric to a level below the top of the metal lines. As such, the low k material forms a portion of the via dielectric and additional steps must be performed to avoid metal line or via metal corrosion. To facilitate corrosion prevention, the second embodiment includes, in addition to the use of a sidewall barrier the following measures: modifying the metal line structure to contain layers of titanium/titanium-nitride, aluminum-copper, and titanium/titanium-nitride (i.e., the ARC layer is no longer titanium-nitride alone, but a titanium/titanium-nitride bi-layer); stop etching the via on the titanium/titanium-nitride layer of the metal line; and use only titanium-nitride for the via liner in lieu of a titanium/titanium-nitride liner.

More specifically, in the second embodiment the metal lines are formed upon a substrate as a stack containing a titanium/titanium-nitride layer, an aluminum-copper layer, and a titanium/titanium-nitride layer. As in the first embodiment, a barrier layer is formed and etched to protect the sidewalls of the metal lines. A layer of low k material is deposited over the lines. In this embodiment, the low k material is not etched back. Instead, a TEOS cap is deposited over the low k material layer and planarized using CMP. The TEOS cap is masked and vias etched through the TEOS cap and low k material layer. The etch is stopped upon the titanium/titanium-nitride layer of the metal line and does not penetrate the aluminum-copper within the line. Thereafter, a titanium-nitride liner is deposited upon the sidewalls and bottom of the via. The via is lastly filled with tungsten or aluminum-copper that does not contact the low k material. Consequently, the barrier layer separates the metal line from the low k material and the via contains no titanium.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

The process of the present invention protects the metals within a multilevel metallization and interconnect structure by incorporating a barrier between the metal lines and a low dielectric constant material (low k material) used as an insulative layer with minimal effect on the overall dielectric constant of the structure.

The first embodiment of the invention (FIGS. 3A–3E) uses such a barrier layer as well as restricts the low k dielectric material to a level below the top of the metal lines. To accomplish the restriction, the low k material is "etched back" below the top level of the lines and, as such, the low k material does not form a portion of the via dielectric. If, however, the low k material cannot be restricted in this manner, a second embodiment of the invention enables the benefits of the first embodiment to be accomplished within a structure that has the low k dielectric as a part of the via dielectric.

Figure 3A:
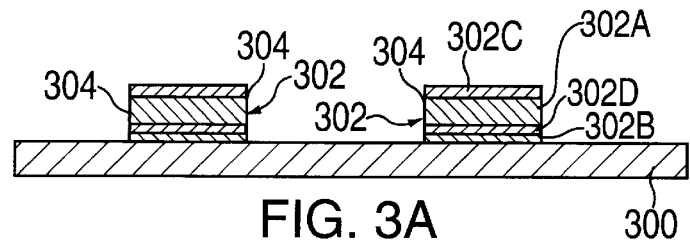
FIGS. 3A–3F depict the process steps of the present invention.

Specifically, FIGS. 3A–3E depict the process steps for forming the BEOL structure in accordance with a first embodiment the present invention. As depicted in FIG. 3A, metal lines 302 are conventionally formed upon a substrate 300 by physical vapor deposition (PVD) of a uniform metal layer, patterning the layer and then etching the layer into metal lines 302. Generally, the metal lines are formed of a stack of metals containing, for example, a titanium layer 302B, a titanium-nitride layer 302D, an aluminum-copper (or aluminum) layer 302A and second titanium-nitride layer 302C, i.e., an aluminum or aluminum/copper interconnect. Alternatively, the metal lines may be formed of a plurality of layers including a first tantalum or tantalum-nitride layer, a copper or copper alloy layer, and a second tantalum or tantalum-nitride layer, i.e., a copper, copper alloy, or aluminum alloy interconnect line. As such, throughout this disclosure, the term metal line is intended to represent either copper, copper alloy, or aluminum interconnect lines as well as other metal line structures that would benefit from a sidewall barrier layer in the form of a sidewall spacer between the metal line and the insulator material.

Figure 3B:
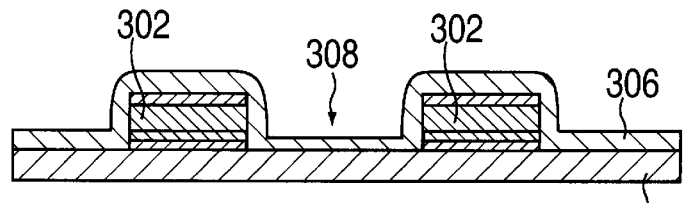
Figure 3C:
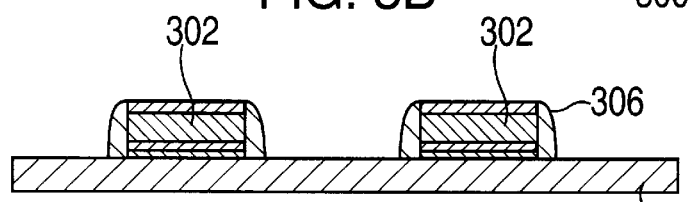

The present invention protects the sidewalls 304 of the metal lines using a sidewall barrier 306. The barrier material can be, for example, silicon nitride, silicon oxynitride, silicon dioxide, or any other material that would impede the corrosion of the metal line including CVD deposited titanium-nitride. Preferably, as shown in FIG. 3B, the barrier is deposited over the metallized lines as a layer 306 using a chemical vapor deposition (CVD) process or physical vapor deposition (PVD), depending upon the barrier material being deposited. As shown in FIG. 3C, the barrier layer 306 is then etched back such that the barrier is removed from all areas, other than the sidewall 304 of the metal lines 302. The barrier layer has a thickness that reduces fluorine corrosion of the metal line, but not so thick that the barrier layer significantly impacts crosstalk along the metal lines, e.g., the thickness is generally less than 500 Å. The etching step of FIG. 3C is necessary to minimize the overall capacitance of the inter-line dielectric region (region 308 of FIG. 3B) and/or for preventing any shorts between adjacent metal lines, depending on the barrier used. For example, if an insulator with a relatively high dielectric constant (e.g., SiN having a k of approximately 7) is used as a barrier, a continuous SiN within region 308 can increase the capacitance of the structure, negating some of the advantages of using low k materials. However, if CVD TiN is used as a barrier, then a continuous TiN layer in the region 308 would provide a conductive path between adjacent metal lines and result in a short circuit.

During the barrier layer etch step, it is not necessary to remove all of the barrier material from the top surface of the metal lines 302, any unetched barrier material provides an additional measure of protection during low k material deposition. The excess barrier is then removed from the top surface of the lines during a subsequent via etch step (discussed below).

Figure 3D:
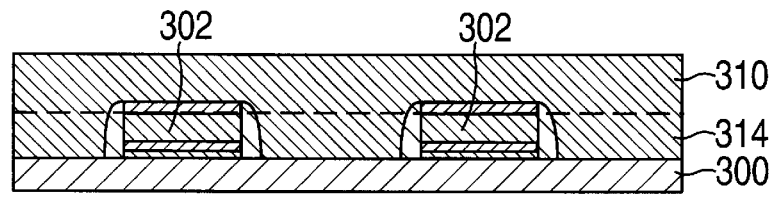

In FIG. 3D, the low k dielectric material is deposited as a layer 310 atop the protected lines 302 and then the layer 310 etched back to dashed line 314. The low k material is deposited using a conventional HDP-CVD process, PE-CVD process, vapor deposition, a spin-on process or any one of a number of other techniques that are available to deposit low k materials. The layer is etched back using a chemistry that is applicable to the low k material, e.g., if the low k material is a-C:F the etchant is an oxygen-based chemistry. To facilitate a uniform etch, a photoresist may be used to control the etch back process step. Such etch back control is especially necessary when the low k material is deposited using an HDP-CVD process. The etch back step ensures that the low k dielectric is restricted to a thickness that maintains the top of the low k dielectric layer below the top of the metal lines, i.e., the low k dielectric is a "line dielectric" that lies between adjacent metal lines.

Figure 3E:
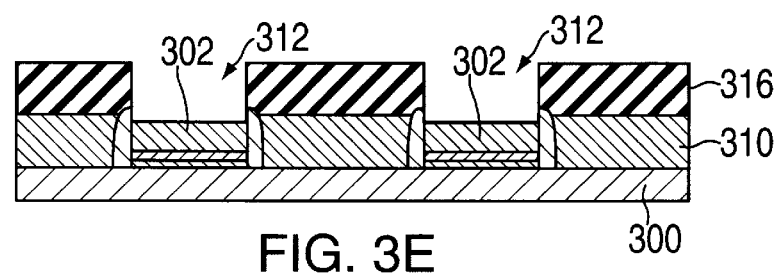
Figure 3F:
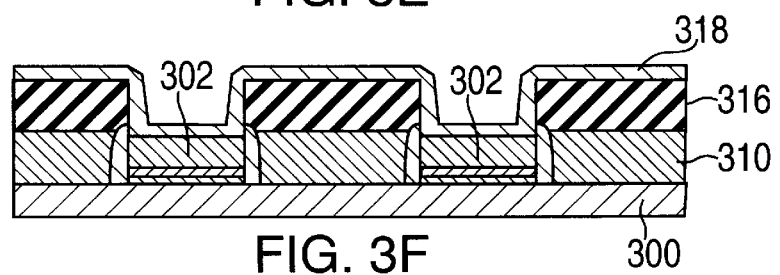

FIG. 3E depicts the structure after a PTEOS layer 316 has been deposited and planarized, and the vias 312 have been patterned and etched into the PTEOS layer 316. The PTEOS layer forms a "via dielectric" that lies between adjacent vias. Note that in this embodiment of the invention the low k material is not part of the via dielectric. While etching the vias, any excess barrier material is removed from the top surface of the lines 302. Additionally, the metal line is generally etched to penetrate into the aluminum-copper layer 302A, i.e., removing the titanium-nitride layer 302C. Lastly, FIG. 3F depicts the process step where a "liner" 318 of, for example, titanium is deposited within the via 312.

Using the foregoing process, the barrier layer 306 ensures that the metal line 302 does not contact the low k material of the insulator layer 310. As such, fluorine penetration from the low k material into the metal line is eliminated. Since the barrier layer is relatively thin, it does not substantially affect the capacitance of the structure.

Figure 4A:
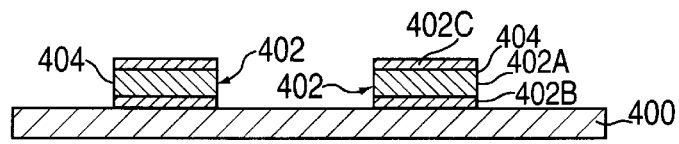
FIGS. 4A–4G depict the process steps of a second embodiment of the present invention.
Figure 4B:
Figure 4C:
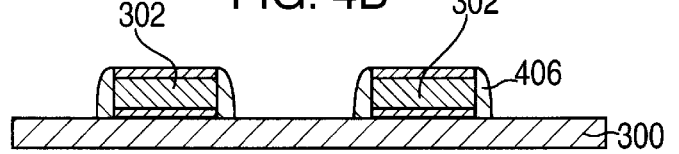
Figure 4D:
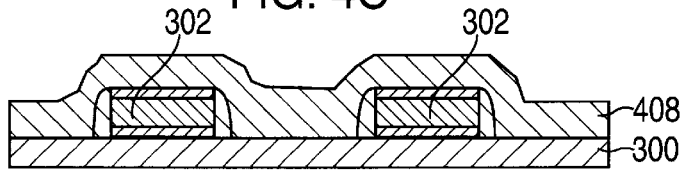
Figure 4E:
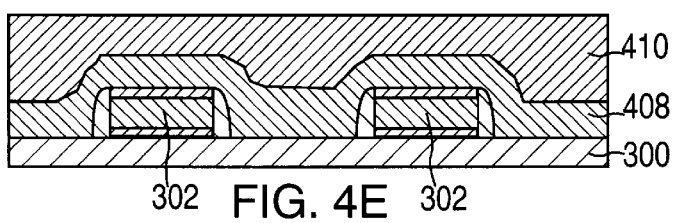

FIGS. 4A–4E depict the process steps of a second embodiment of the invention that facilitates metal line protection when the low k dielectric material can not be etched back below the level of the metal lines. FIG. 4A depicts a metal line 402 comprising a metal stack of, for example, an aluminum-copper layer 402A sandwiched between a pair of titanium/titanium-nitride layers 402B and 402C. As with the previous embodiment, in FIG. 4B, a barrier layer 406 is deposited over the lines 402 to protect the sidewalls 404 of the metal lines 402. In FIG. 4C the layer 413 is anisotropically etched to form the sidewall protection. In FIG. 4D, a layer 408 of low k material is conventionally deposited either by HDP-CVD, PE-CVD, vapor, or spin-on deposition or using any one of a number of other techniques available for low k material deposition. As shown in FIG. 4E, a cap layer 410 of TEOS material is deposited over the layer 408 of low k material. Note that in this embodiment, the low k layer is not etched back as in the previous embodiment. As such, the low k material forms part of the via dielectric, i.e., the dielectric material between adjacent vias. Since the low k material is part of the via dielectric certain steps are taken to protect the via liner and filler from corrosion. These steps are discussed below.

Figure 4F:
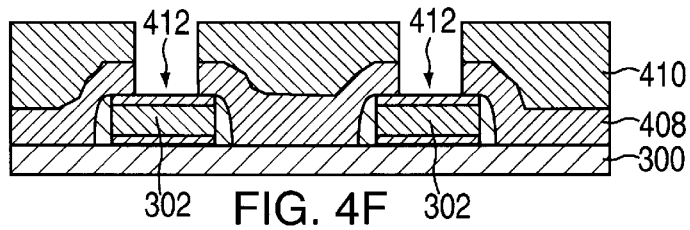
Figure 4G:
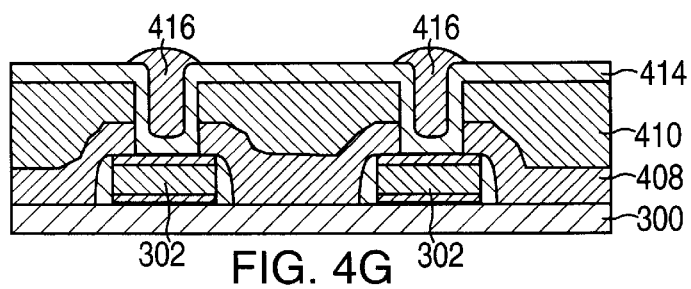

Next, the cap layer 410 is planarized by chemical mechanical polishing (CMP) or some other planarizing technique. In FIG. 4F, a mask is used to define vias and the vias are etched through both the cap layer 410 and the low k material layer 408. Each of the vias 412 extend to the metal lines 402 but the etch is stopped upon contact with the titanium-nitride layer 402C. As shown in FIG. 4G, a titanium nitride "liner" 414 is deposited along the sidewalls and bottom of the via 412. As such, the titanium nitride liner 414 will protect the aluminum-copper or tungsten filler 416 from contacting the low k material of layer 408.

Figure 1A:
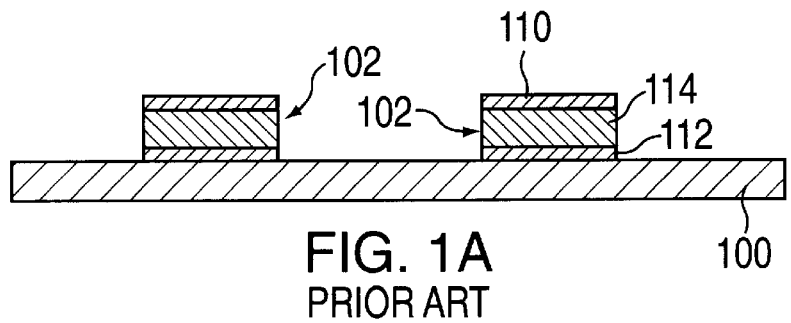
FIGS. 1A–1D depict a prior art process for forming BEOL structures.
Figure 1B:
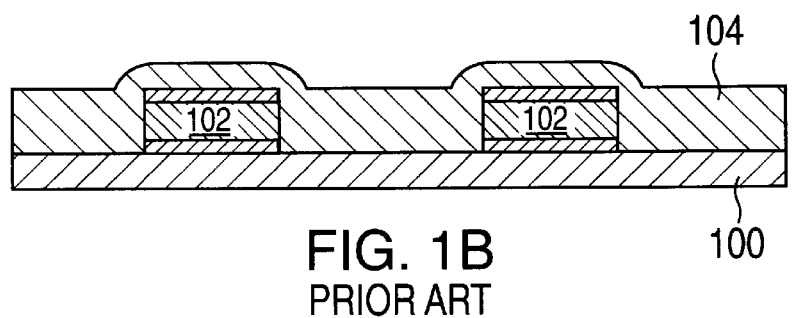
Figure 1C:
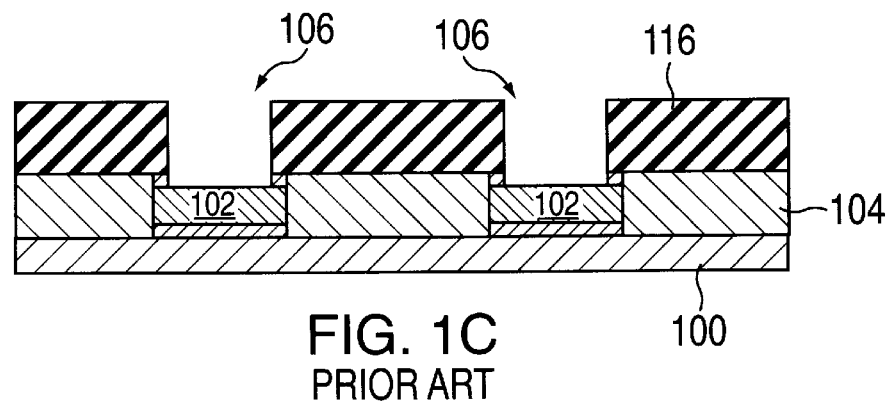
Figure 1D:
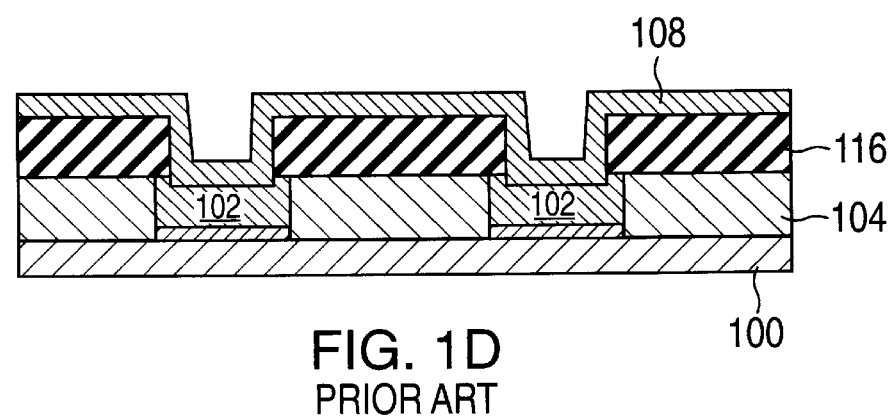
Figure 2:
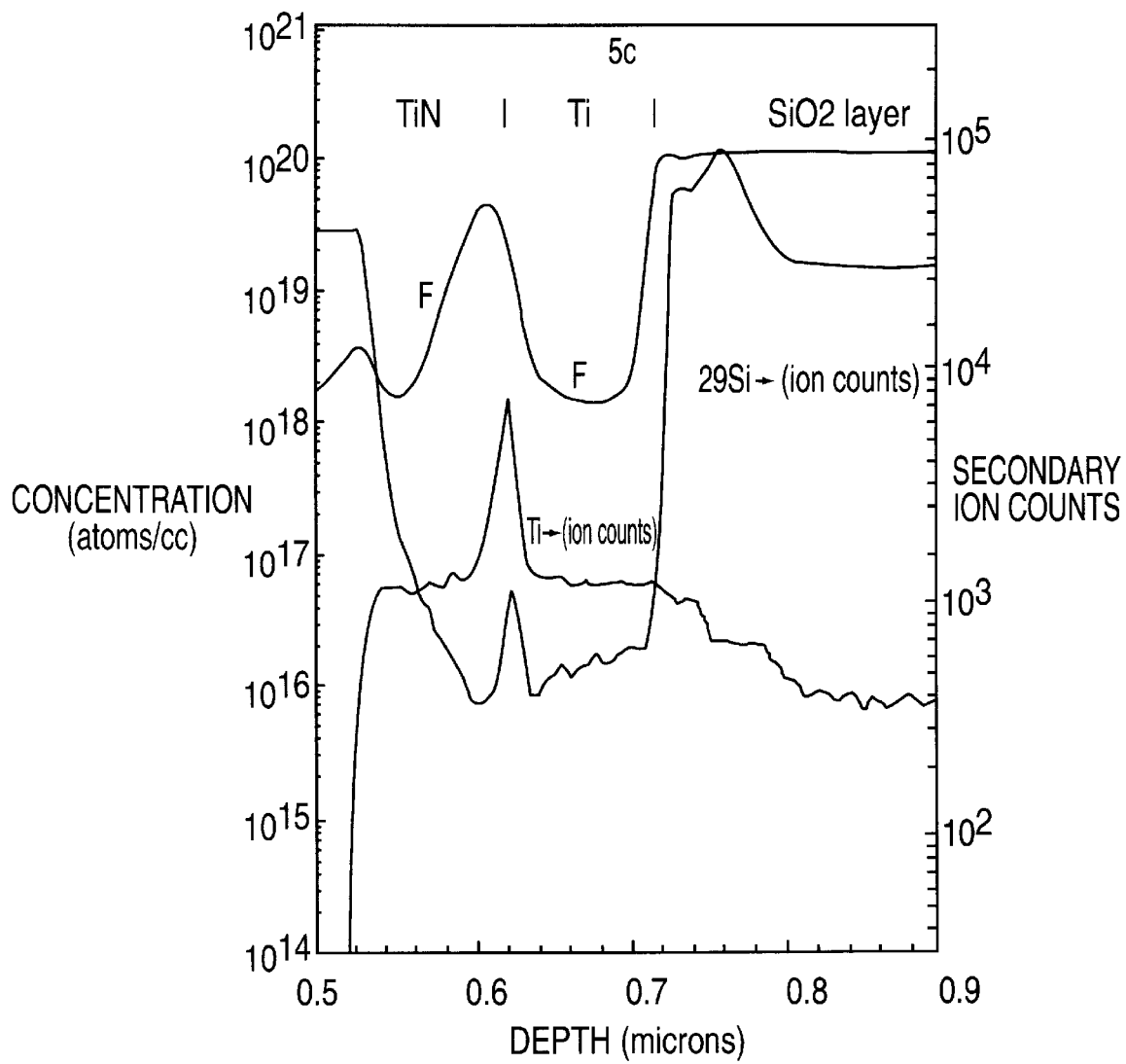
FIG. 2 depicts a SIMS depth profile of the conventional BEOL structure using a fluorine-based dielectric.
Figure 5:
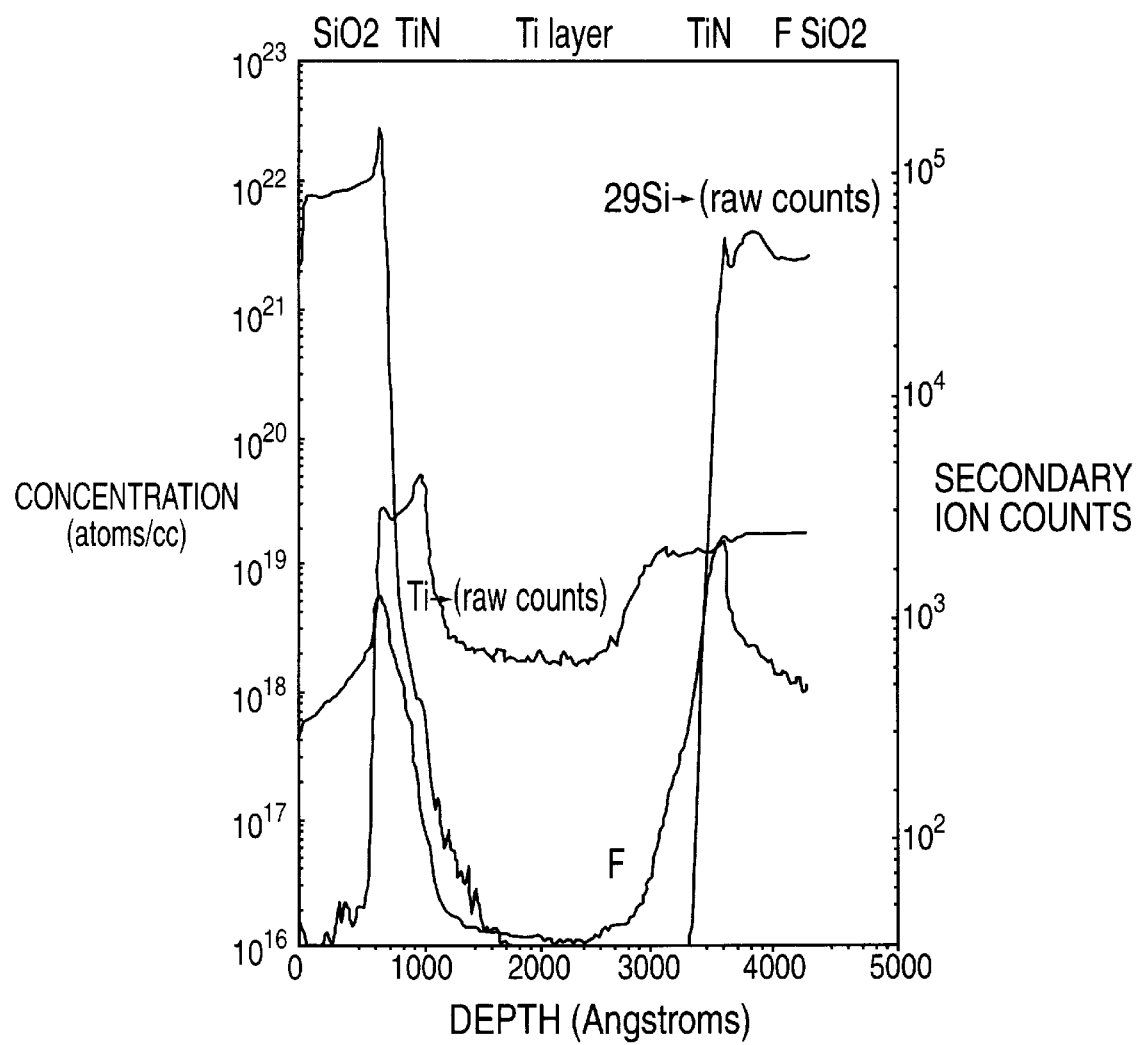
FIG. 5 depicts a SIMS depth profile of the BEOL structure produced by the present invention.

FIG. 5 depicts a SIMS depth profile of fluorine penetration (curve 500) into Ti for a $SiO_2$/TiN/Ti/HDP-FSG stack annealed for 2 hours at 450° C. Note, the TiN between Ti and FSG prevents any fluorine from defusing into the Ti, in contrast to the prior art, where the fluorine substantially penetrates into the Ti, as depicted in curve 200 of FIG. 2.

Although various embodiments which incorporate the teachings of the present invention have been shown and described in detail herein, those skilled in the art can readily devise many other varied embodiments that still incorporate these teachings.

What is claimed is:

1. A method of forming a multilevel metallization and interconnect structure comprising the steps of:

forming a metal line upon a surface of a substrate, where said metal line has a top surface and sidewalls;

depositing a barrier layer over the metal line and said surface of said substrate;

removing a portion of the barrier layer where said barrier layer remains deposited on at least said sidewalls of said metal line;

depositing a first insulative layer over said metal line, said surface of said substrate and said barrier layer, where said insulative layer is a material that, but for the barrier layer protecting the sidewalls of the metal line, would react with a material of said metal line;

depositing a second insulative layer over the first insulative layer; and, forming a via that contacts a top surface of said metal line.

2. The method of claim 1 wherein the step of depositing the second insulative layer further comprises the step of:

etching back the first insulative layer until a surface of the first insulative layer is below the top surface of the metal line; and, the forming step further comprises the steps of:
- planarizing the second insulative layer;
- etching said via into said second insulative layer to expose said top surface of said metal line; and
- depositing a conductive material into said via.

3. The method of claim 1 wherein the forming step further comprises the steps of:
- planarizing the second insulative layer;
- etching a via through said first and second insulative layers to contact the top surface of the metal line; and
- depositing a conductive liner within said via, where a material of said conductive liner is inert with respect to the material of the first insulative layer.

4. The method of claim 1 wherein said removing step does not remove all of the barrier layer from the top surface of the metal line.

5. The method of claim 1 wherein said material of said first insulative layer has a dielectric constant that is less than or equal to 3.8.

6. The method of claim 1 wherein said material of said first insulative layer contains fluorine.

7. The method of claim 2 wherein said metal line further comprises:
- a layer of titanium;
- a first layer of titanium-nitride;
- a layer of aluminum or an aluminum-copper alloy; and
- a second layer of titanium-nitride.

8. The method of claim 2 wherein said metal line further comprises:
- a first layer of tantalum or tantalum-nitride;
- a layer of copper or copper alloy; and
- a second layer of tantalum or tantalum-nitride.

9. The method of claim 3 wherein said metal line further comprises:
- a first layer of titanium/titanium-nitride;
- a layer of aluminum or an aluminum-copper alloy; and
- a second layer of titanium/titanium-nitride.

10. The method of claim 3 wherein said liner layer is fabricated of titanium-nitride.

11. The method of claim 1 wherein the barrier layer is fabricated of a material that impedes corrosion of the metal line by the first insulative layer.

12. The method of claim 1 wherein the barrier layer is fabricated of a material selected from one or more of the following materials: silicon nitride, silicon oxynitride, and silicon dioxide.

13. The method of claim 1 wherein the barrier layer has a thickness of less than 500 Å.

* * * * *